US007781891B2

(12) United States Patent
Sakamoto et al.

(10) Patent No.: US 7,781,891 B2
(45) Date of Patent: Aug. 24, 2010

(54) SWITCHING ELEMENT AND RECONFIGURABLE LOGIC INTEGRATED CIRCUIT

(75) Inventors: Toshitsugu Sakamoto, Tokyo (JP); Hisao Kawaura, Tokyo (JP)

(73) Assignee: Nec Corporation, Tokyo (JP)

( * ) Notice: Subject to any disclaimer, the term of this patent is extended or adjusted under 35 U.S.C. 154(b) by 423 days.

(21) Appl. No.: 11/813,072

(22) PCT Filed: Dec. 22, 2005

(86) PCT No.: PCT/JP2005/023571
§ 371 (c)(1), (2), (4) Date: Jun. 28, 2007

(87) PCT Pub. No.: WO2006/070681
PCT Pub. Date: Jul. 6, 2006

(65) Prior Publication Data
US 2008/0211096 A1 Sep. 4, 2008

(30) Foreign Application Priority Data
Dec. 28, 2004 (JP) .............................. 2004-378699

(51) Int. Cl.
H01L 29/40 (2006.01)
H01L 21/00 (2006.01)
(52) U.S. Cl. ......................................... 257/773; 438/81
(58) Field of Classification Search ................. 257/751, 257/758, E23.01, 3, 41, 773, E23.141–E23.179, 257/E21.514; 438/81, 666
See application file for complete search history.

(56) References Cited

U.S. PATENT DOCUMENTS

| | | | | |
|---|---|---|---|---|
| 5,761,115 A | * | 6/1998 | Kozicki et al. | ............... 365/182 |
| 7,050,319 B2 | * | 5/2006 | Moore et al. | ................... 365/63 |
| 7,186,998 B2 | * | 3/2007 | Ovshinsky et al. | ............. 257/3 |

FOREIGN PATENT DOCUMENTS

| | | |
|---|---|---|
| JP | 2000-512058 A | 9/2000 |
| JP | 2001-525606 A | 12/2001 |
| JP | 2002-536840 A | 10/2002 |
| JP | 2003-92387 A | 3/2003 |
| WO | WO 97/48032 (A2) | 12/1997 |
| WO | WO 99/28914 (A2) | 6/1999 |
| WO | WO 00/48196 (A1) | 8/2000 |
| WO | WO 03/094227 A1 | 11/2003 |

OTHER PUBLICATIONS

T. Sakamoto et al., A nonvolatile programmable solid electrolyte nanometer switch, Solid-State Circuits Conference, 2004. Digest of Technical Papers. ISSCC. 2004 IEEE International, 2004, pp. 290 to 291.
T. Sakamoto et al., "Nanometer-scale switches copper sulfide", Applied Physics Letters, 2003, vol. 82, No. 18, pp. 3032 to 3034.

\* cited by examiner

Primary Examiner—Calvin Lee
(74) Attorney, Agent, or Firm—Sughrue Mion, PLLC

(57) ABSTRACT

A switching element is of a configuration that includes: an ion conduction layer (40) for conducting metal ions, a first electrode (21) and a second electrode (31) provided in contact with the ion conduction layer, a third electrode (35) that can supply metal ions to the ion conduction layer, and a diffusion prevention layer (90) provided between the ion conduction layer (40) and the third electrode (35) for preventing the diffusion of metal ions from the third electrode (35) to the ion conduction layer (40). By adopting this configuration, the set state of a switch can be maintained with greater stability.

10 Claims, 4 Drawing Sheets

SWITCHING ELEMENT AND RECONFIGURABLE LOGIC INTEGRATED CIRCUIT

TECHNICAL FIELD

The present invention relates to a switching element that uses an electrochemical reaction and to a reconfigurable logic integrated circuit.

BACKGROUND ART

Application specific LSI (ASIC: Application Specific Integrated Circuits) are provided with a plurality of logic cells, which are basic logic circuits, and the logic cells are selected for operation according to the user's specifications. ASIC include both conventional ASIC in which the logic cells are determined in an interconnect patterning step during the process of fabrication, and programmable logic in which logic cells are determined by the user after shipment of the product (reconfigurable logic integrated circuits). Although conventional ASIC have the merit of low unit product price achieved by mass production, they also suffer from the demerits that their development is both expensive and time-consuming. Programmable logic, on the other hand, are more expensive per unit than conventional ASIC, have slower operation speed, and consume more power, but are advantageous in that their development is inexpensive and takes little time. Development is now in progress to both reduce the size of programming switching elements and improve the operation performance in order to reduce the product unit cost, increase the operating speed, and reduce the power consumption of programmable logic.

FIG. 1 is a schematic view showing an example of the configuration of programmable logic of the related art.

Programmable logic 110 as shown in FIG. 1 is made up from: a multiplicity of logic cells 112 arranged in a two-dimensional array; interconnects for interconnecting the logic cells; and a multiplicity of switches 114 for switching between connection and non-connection between interconnects. Changing the connection states (connection/non-connection) of two-terminal switches sets the configuration of interconnects between logic cells and the functions of the logic cells to enable the realization of a logic integrated circuit that meets specifications. In the following explanation of the background art, the programmable device disclosed in JP-A-2002-536840 is used in switch 114. In the following explanation, a programmable device is referred to as a two-terminal switch.

A two-terminal switch includes: an ion conduction layer and a first electrode and second electrode arranged with the ion conduction layer interposed. The ion conduction layer is a conductive medium for metal ions supplied from the second electrode. When a negative voltage is applied to the first electrode relative to the second electrode, metal precipitates at the portion of ion conduction layer that contacts the first electrode and grows toward the second electrode, whereby the first electrode and second electrode are connected by the precipitate metal. This is the ON state. Conversely, when a positive voltage is applied to the first electrode relative to the second electrode, the metal that has precipitated dissolves in the ion conduction layer to cut the connection between the first electrode and the second electrode. This is the OFF state. In the following explanation, the voltage that is applied to the first electrode for the making the transition from the ON state to the OFF state or from the OFF state to the ON state is referred to as the switching voltage.

The first electrode of this two-terminal switch is connected to signal line 116 in programmable logic 110, and the second electrode is connected to logic cell 112. A two-terminal switch that has been set to the ON state by the user's operation maintains the state in which the first electrode and second electrode are electrically connected. When a logic signal reaches the first electrode by way of signal line 116, the logic signal is received in logic cell 112 by way of the second electrode.

A two-terminal switch that has been set to the OFF state maintains the state in which the electrical connection between the first electrode and second electrode is cut. In this case, even when a logic signal arrives at the first electrode by way of signal line 116, the logic signal cannot be received in logic cell 112 that is connected to the second electrode.

Thus, in programmable logic, a two-terminal switch that has been set to the ON state by the user functions as a signal line, and a logic cell that is connected to a two-terminal switch in the ON state is maintained in an operable state.

On the other hand, the present inventors are developing a three-terminal switch in which this two-terminal switch is equipped with a third electrode that serves as a control electrode for switching states. In a three-terminal switch, the metal that connects the first electrode and the second electrode can be made thicker in the ON state and the resistance between the first electrode and the second electrode can be made smaller than for a two-terminal switch.

DISCLOSURE OF THE INVENTION

A logic signal that is applied as input to a three-terminal switch normally has a voltage that is one of 0 V and Vdd, which is the operating voltage of a logic circuit. As a result, a logic signal having a voltage of either Vdd or 0 V is applied as input to first electrode and second electrode.

When the third electrode is set to the ground potential after the three-terminal switch has been set to the ON state, the first electrode and second electrode have a higher voltage than the third electrode when a logic signal of Vdd is applied as input to the three-terminal switch. The first electrode and the second electrode are pulled to a higher voltage relative to the third electrode, and as a result, the precipitated metal in some cases dissolves in the ion conduction layer and precipitates on the third electrode. When this phenomenon repeats, not only do the electrical characteristics such as the resistance and capacitance between the first electrode and the second electrode change, but the connection between the first electrode and the second electrode is also cut. As a result, the three-terminal switch transitions to the OFF state from the ON state that has been set.

Explanation next regards a case in which a three-terminal switch is set to the OFF state. When a state is set in which Vdd is applied to the third electrode and a logic signal of Vdd is applied as input to the first and second electrodes of the three-terminal switch, the first electrode, the second electrode, and the third electrode attain the same voltage, whereby the phenomenon that occurs when the ON state is set does not take place. On the other hand, when a logic signal having a voltage of 0 V is applied to the first electrode or the second electrode while Vdd is applied to the third electrode, the voltage of the third electrode becomes higher than the first electrode or the second electrode. The third electrode is pulled up to a higher voltage than the first electrode or the second electrode, and as a result, a minute amount of metal ions from the third electrode dissolve in the ion conduction layer and metal precipitates so as to bury the cut location between the first electrode and the second electrode. When this phenomenon is repeated, the first electrode and the second electrode are connected by the precipitated metal. As a result, the three-terminal switch transitions to the ON state from the OFF state that has been set.

The time interval over which the state of the three-terminal switch is maintained (the time interval over which nonvolatility is maintained) must be at least as long as the product life over which the programmable logic is used (typically ten years). When the state of switches changes as a result of the logic signal itself, the problem occurs that the switch does not function as a switch. As previously described, this problem also occurs when the switching voltage is higher than the operating voltage of the logic signal.

The present invention was achieved for solving the problems of the above-described related art and has as its object the provision of a switching element and reconfigurable logic integrated circuit that maintain the set state of the switch with greater stability.

A switching element of the present invention for achieving the above-described object is of a configuration that includes: an ion conduction layer for conducting metal ions; a first electrode and a second electrode provided in contact with the ion conduction layer; a third electrode that can supply metal ions to the ion conduction layer; and a diffusion prevention layer provided between the ion conduction layer and the third electrode for preventing the diffusion of metal ions from the third electrode to the ion conduction layer.

In the present invention, the provision of a diffusion prevention layer between the ion conduction layer and the third electrode prevents the diffusion of metal ions from the third electrode to the ion conduction layer even when a signal voltage is applied to the first electrode and second electrode and a difference in potential occurs between the third electrode and the first and second electrodes.

In addition, the switching element of the present invention is of a configuration that includes: an ion conduction layer for conducting metal ions; a first electrode and second electrode provided in contact with the ion conduction layer and to which a signal voltage is applied as input from the outside; a third electrode provided in contact with the ion conduction layer that can supply metal ions; and a constant-voltage unit for applying to the third electrode a voltage that is one-half the maximum value of the above-described signal voltage.

Still further, the switching element of the present invention is of a configuration that includes: an ion conduction layer for conducting metal ions; a first electrode and a second electrode provided in contact with the ion conduction layer and to which a signal voltage is applied as input from the outside; a third electrode provided in contact with the ion conduction layer and that can supply metal ions; and a switch for cutting off current to the third electrode.

In any of the above-described switching elements of the present invention, the diffusion of metal ions from the third electrode to the ion conduction layer is prevented after either one of the ON state and OFF state has been set, whereby an electrochemical reaction in the element is suppressed. As a result, the set state is maintained with greater stability, and changes of the set state are prevented over a long time of use.

EXPLANATION OF REFERENCE NUMBERS 21, 26 first electrode
31, 32 second electrode
34, 35 third electrode
40, 42 ion conduction layer
90 diffusion prevention layer

BEST MODE FOR CARRYING OUT THE INVENTION

The switching element of the present invention is a device in which the provision of a diffusion prevention layer between the third electrode and the ion conduction layer prevents the diffusion of metal ions from the third electrode and precipitated metal when logic signals are applied as input from the outside after the state of the switch has been set.

FIRST WORKING EXAMPLE

Figure 1:
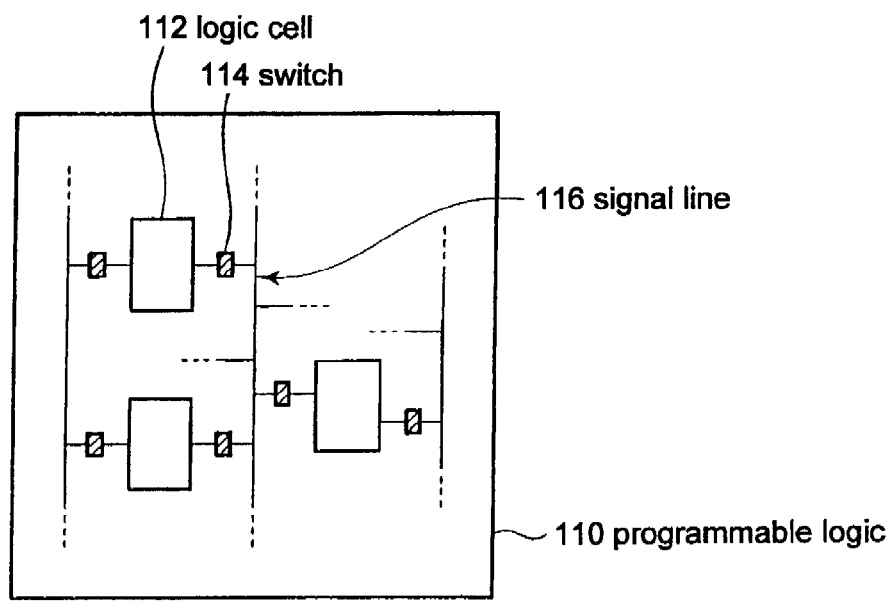
FIG. 1 is a schematic view showing an example of the configuration of programmable logic of the related art.
Figure 2:
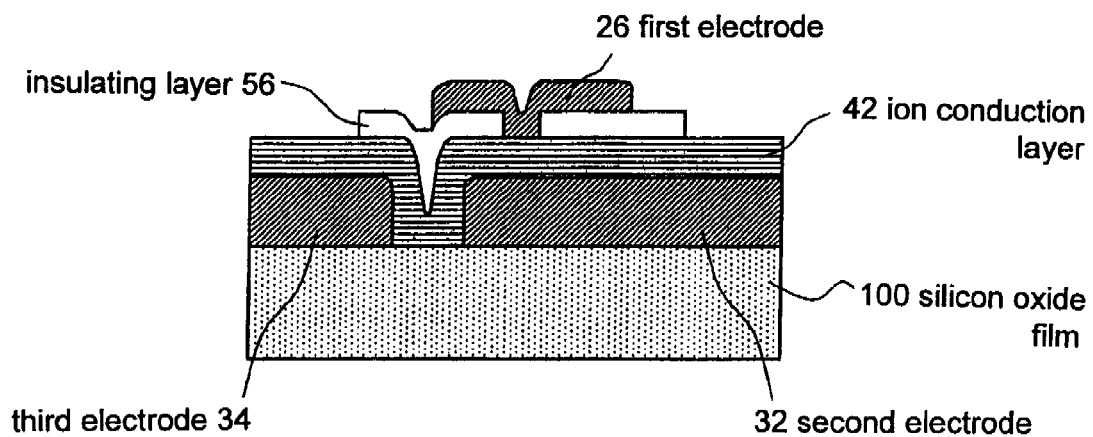
FIG. 2 is a schematic sectional view showing an example of the configuration of a switch used in the present invention.

Explanation next regards the configuration of the switch of the present working example. FIG. 2 is a schematic sectional view showing an example of the configuration of the three-terminal switch of the present working example.

As shown in FIG. 2, the three-terminal switch is provided with second electrode 32 and third electrode 34 that are composed of copper on silicon oxide film 100 formed on the surface of a silicon substrate. Second electrode 32 and third electrode 34 are separated from each other by a distance on the order of from 100 nm to 1 µm. Ion conduction layer 42 composed of copper sulfide is provided to cover the upper surfaces and side surfaces of second electrode 32 and third electrode 34. Insulating layer 56 having an aperture with a diameter of 0.2 µm is formed on ion conduction layer 42. Insulating layer 56 is formed from calixarene. The aperture is provided at a position that confronts second electrode 32 with ion conduction layer 42 interposed. First electrode 26 composed of platinum is formed on insulating layer 56. First electrode 26 contacts ion conduction layer 42 by way of the aperture of insulating layer 56.

Explanation next regards the method of fabricating the three-terminal switch shown in FIG. 2.

Silicon oxide film 100 having a film thickness of 300 nm is formed on the surface of a silicon substrate. Using conventional lithographic techniques, a resist pattern is formed at points on silicon oxide film 100 on which second electrode 32 and third electrode 34 are not to be formed. After next forming copper to a film thickness of 100 nm by a vacuum evaporation method, the resist pattern is lifted off by means of a lift-off technique to form the remaining portions of the copper as second electrode 32 and third electrode 34. At this time, the distance between second electrode 32 and third electrode 34 is set to the above-described value by the dimensions of the resist pattern of the lithographic technique.

Next, using a laser ablation method, copper sulfide that is to serve as the ion conduction layer is formed to a film thickness of 40 nm to cover the upper surfaces and side surfaces of second electrode 32 and third electrode 34. Calixarene that is to serve as insulating layer 56 is next applied to a film thickness of 120 nm on ion conduction layer 42 by means of a spin coat technique, following which a pattern having an aperture with a diameter of 0.2 µm is formed on insulating layer 56 by means of a lithographic technique. At this time, the aperture is formed at a position on insulating layer 56 that is above second electrode 32. First electrode 26 is then formed by successively carrying out the formation of a resist pattern, vacuum evaporation of platinum having a film thickness of 40 nm, and a lift-off technique.

Explanation next regards the operation of the three-terminal switch shown in FIG. 2.

Second electrode 32 and third electrode 34 are grounded and a negative voltage is then applied to first electrode 26. The application of a negative voltage to first electrode 26 causes a metal dendrite of copper to grow from the surface of the first electrode at the position of the aperture of insulating layer 56 to second electrode 32, whereby the two electrodes are electrically connected and the three-terminal switch enters the ON state.

To turn the three-terminal switch OFF, a negative voltage is applied to third electrode 34 relative to first electrode 26 and second electrode 32 in which the voltage is equalized. The application of negative voltage to third electrode 34 causes the copper that makes up the above-described metal dendrite to become copper ions and dissolve in ion conduction layer 42, following which the dissolved copper ions become copper and precipitate on the surface of the third electrode. As a result, a portion of the meal dendrite is electrically cut, whereby the three-terminal switch transitions to the OFF state. In addition, electrical properties undergo changes such as an increase in the resistance between first electrode 26 and second electrode 32 and change in the capacitance between the electrodes from the stage preceding the complete disconnection of the electrical connection, following which the electrical connection is finally cut.

On the other hand, when the three-terminal switch is in above-described OFF state and a positive voltage is applied to third electrode 34 relative to second electrode 32, third electrode 34 supplies copper ions to ion conduction layer 42. In addition, the copper ions from ion conduction layer 42 become copper and precipitate on the portion of the metal dendrite that has been electrically cut. The metal dendrite then connects first electrode 26 and second electrode 32, whereby the three-terminal switch transitions to the ON state.

Explanation next regards a case in which the three-terminal switch shown in FIG. 2 is used as a programmable logic switch.

Figure 3:
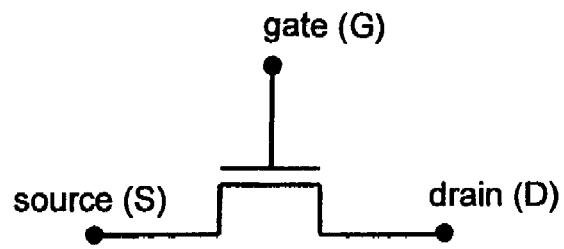
FIG. 3 is a circuit diagram of the switch shown in FIG. 2.

FIG. 3 is a circuit diagram of the three-terminal switch shown in FIG. 2.

Figure 4:
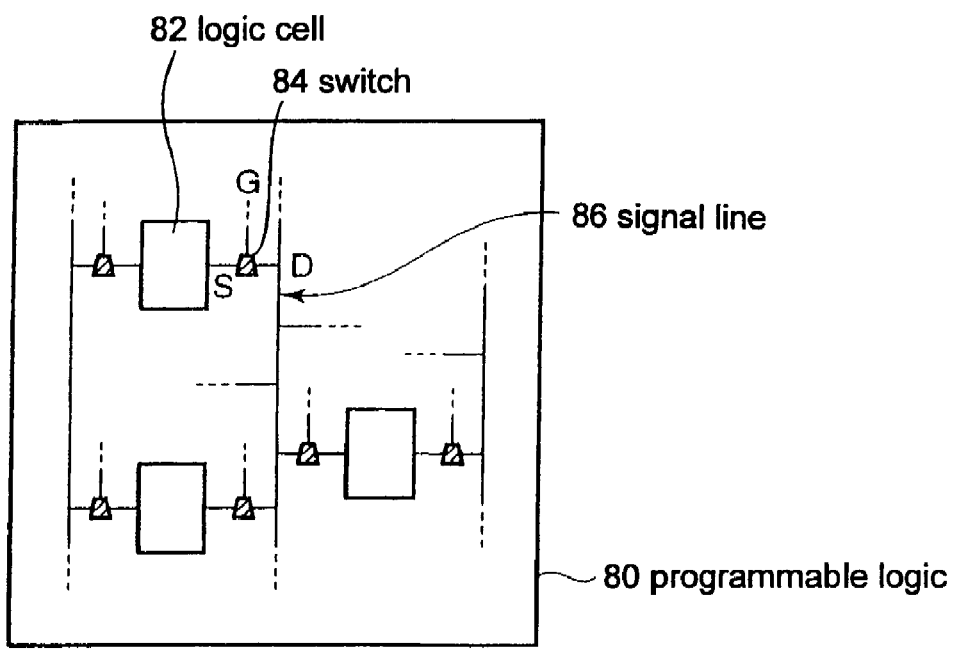
FIG. 4 is a schematic view showing an example of the configuration in which the switch of the present invention is applied to programmable logic.

FIG. 4 is a schematic view showing an example of a configuration in which the three-terminal switch shown in FIG. 2 is applied in programmable logic.

Drain electrode D shown in FIG. 3 corresponds to first electrode 26, source electrode S corresponds to second electrode 32, and gate electrode G corresponds to third electrode 34. As shown in FIG. 4, source electrode S is connected to logic cell 82, and drain electrode D is connected to signal line 86 in programmable logic 80. A three-terminal switch that has been set to the ON state maintains a state in which the source electrode S and drain electrode D are electrically connected.

In contrast, a three-terminal switch that has been set to the OFF state maintains a state in which the electrical connection between source electrode S and the drain electrode D is cut.

Figure 5A:
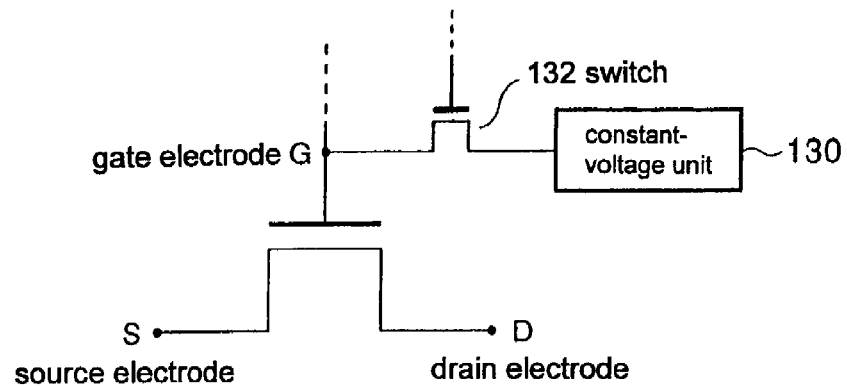
FIG. 5A is a circuit diagram showing an example of the configuration of a switch of the first working example.
Figure 5B:
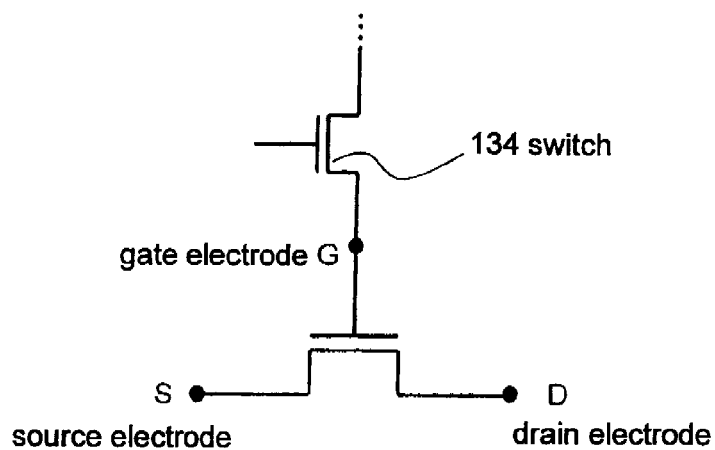
FIG. 5B is a circuit diagram showing an example of the configuration of the switch of the first working example.

FIGS. 5A and 5B are circuit diagrams showing the three-terminal switch of the present working example.

As shown in FIG. 5A, the three-terminal switch is equipped with constant-voltage unit 130 for applying a fixed voltage to the gate electrode. The three-terminal switch is further equipped with switch 132 between the gate electrode and constant-voltage unit 130 for, when the switching voltage is to be applied to the gate electrode, implementing switching such that the voltage from the constant-voltage unit is applied from the signal line for connection. After setting the state of the three-terminal switch to ON or OFF, the user switches switch 132 to use constant-voltage unit 130 to apply a voltage of ($\frac{1}{2}$)Vdd to the gate electrode.

In this case, despite the application of a logic signal of Vdd to the drain electrode and the source electrode, the difference in potential between these two electrodes and the gate electrode is ($\frac{1}{2}$)Vdd or one-half the difference in potential in the related art. Even when a logic signal of 0 V is applied as input to the drain electrode and the source electrode, the difference in potential between these two electrodes and the gate electrode is ($\frac{1}{2}$)Vdd or one-half the difference in potential of the related art.

Setting a state in which ($\frac{1}{2}$)Vdd is applied to the gate electrode achieves greater suppression of the electrochemical reaction than in the related art. As a result, the reaction by which a portion of the gate electrode becomes copper ions and dissolves in the ion conduction layer is suppressed, and further, the reaction by which precipitated metal dissolves into the ion conduction layer is also suppressed. The stability of the three-terminal switch when switching is not being implemented is therefore improved.

After the state of the three-terminal switch has been set, the gate electrode may be kept in a floating state. FIG. 5B is a circuit diagram showing an example of the configuration of a three-terminal switch for maintaining the gate electrode in a floating state.

As shown in FIG. 5B, the three-terminal switch is equipped with switch 134 for maintaining the gate electrode in a floating state.

After setting the state of the three-terminal switch, the user operates switch 134 to set the gate electrode in a floating state. Even when voltage is applied to the gate electrode as noise from a signal line in programmable logic 80, a voltage of no more than the maximum Vdd is applied to the gate electrode in the floating state. Further, if in the floating state, the gate electrode is not supplied with the current necessary for an electrochemical reaction, and the reactions for generating and precipitating metal ions between the gate electrode and ion conduction layer is therefore suppressed. Accordingly, the ON or OFF state is maintained if the gate electrode is in the floating state.

Even when a logic signal is applied as input to the drain electrode and source electrode resulting in the application of a voltage of Vdd or 0 V to these two electrodes, the gate electrode is in the floating state and, due to the above-described point, the stability of the three-terminal switch is improved during the time that switching is not implemented.

In the present working example, the switching element of the present invention was used for switching between connection and non-connection to logic cells, but the present invention can also be applied to a switch for switching interconnects or for switching the functions of logic cells. Examples of programmable logic in which the circuit configuration is altered by means of electronic signals and which can offer a multiplicity of functions by means of a single chip include FPGA (Field-Programmable Gate Array) and DRP (Dynamically Reconfigurable Processor).

SECOND WORKING EXAMPLE

Figure 6:
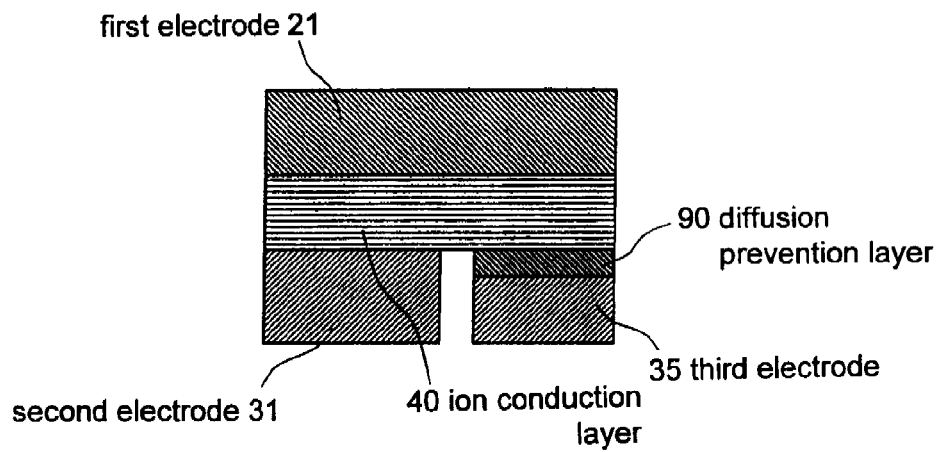
FIG. 6 is a schematic sectional view showing an example of the configuration of the switch of the second working example.

The present working example is a device for improving the retention characteristic of the switch by providing a diffusion prevention layer between the third electrode and first electrode. FIG. 6 is a schematic sectional view showing an example of the configuration of the switch of the present working example.

As shown in FIG. 6, the three-terminal switch is of a configuration that includes: first electrode 21, second electrode 31 formed such that ion conduction layer 40 is interposed between second electrode 31 and first electrode 21, and third electrode 35 that can supply metal ions to ion conduction layer 40. The distance between second electrode 31 and third electrode 35 is 0.2 μm, and second electrode 31 and third electrode 35 are arranged separated by this distance. Diffusion prevention layer 90 is formed between third electrode 35 and ion conduction layer 40. Diffusion prevention layer 90 is formed of tantalum oxide. This diffusion prevention layer 90 can supply metal ions to ion conduction layer 40 from third electrode 35 when a switching voltage is applied to third electrode 35. When a difference in potential occurs in the operating voltage of logic signal between third electrode 35 and either one of first electrode 21 and second electrode 31, the operating voltage of the logic signal is lower than the switching voltage, whereby the dissolution of metal ions from third electrode 35 is prevented and the penetration of metal ions into third electrode 35 from ion conduction layer 40 is prevented. Furthermore, a metal dendrite is formed in the ON state, as in the first working example. Still further, the operations for transition from the ON state to the OFF state and from the OFF state to the ON state are the same as in the first working example, and detailed explanation of these operations is therefore here omitted.

In the three-terminal switch of the present working example, diffusion prevention layer 90 suppresses the diffusion of metal ions, whereby the diffusion of copper ions from third electrode 35 is suppressed and the penetration of metal ions into third electrode 35 from ion conduction layer 40 is suppressed, improving the stability of the three-terminal switch when switching is not implemented.

THIRD WORKING EXAMPLE

In the present working example, a configuration is adopted in which a diffusion prevention layer is provided not only between the third electrode and the first electrode, but also between the second electrode and the first electrode.

Explanation next regards the configuration of the switch of the present working example. Components of the configuration that are the same as those of the first working example are given identical reference numbers and explanation of the details of these components is here omitted.

Figure 7:
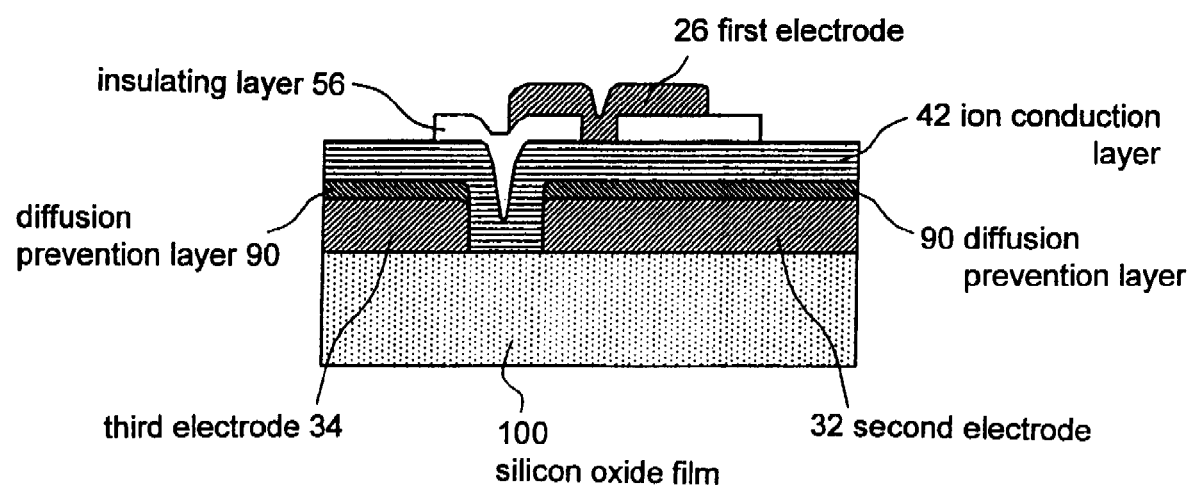
FIG. 7 is a schematic sectional view showing an example of the configuration of the switch of the third working example.

FIG. 7 is a schematic sectional view showing an example of the configuration of the switch of the present working example. As shown in FIG. 7, in the switch of the present working example, diffusion prevention layer 90 composed of copper chloride is formed on second electrode 32 and third electrode 34. An aperture provided in insulating layer 56 is positioned to confront second electrode 32 with ion conduction layer 42 and diffusion prevention layer 90 interposed. The diameter of the aperture provided in insulating layer 56 is 0.2 μm. The distance between second electrode 32 and third electrode 34 is from 100 nm to 1 μm, and second electrode 32 and third electrode 34 are arranged separated by this distance.

Explanation next regards the method of fabricating the switch shown in FIG. 7.

After forming silicon oxide film 100 with a film thickness of 300 nm on a silicon substrate, a resist pattern is formed by conventional lithographic techniques at points at which second electrode 32 and third electrode 34 are not to be formed. Over this resist pattern, copper with a thickness of 100 nm that is to serve as second electrode 32 and third electrode 34 is then formed by a vacuum evaporation method, and copper chloride with a film thickness of 20 nm that is to serve as the diffusion prevention layer is formed by a laser ablation method, following which the resist pattern is lifted off by a lift-off technique to form second electrode 32 and third electrode 34 that are covered by diffusion-prevention layer 90. Ion conduction layer 42, insulating layer 56, and first electrode 26 are next formed similarly to the first working example.

In addition to the effects of the first working example, diffusion prevention layer 90 in the three-terminal switch of the present working example suppresses the diffusion of copper ions from second electrode 32 and suppresses the penetration of metal ions into second electrode 32 from ion conduction layer 42, and the stability of the three-terminal switch is therefore improved when switching is not implemented.

The switch of either of the second working example and the third working example may be applied in a switch of programmable logic, similar to the first working example.

In the switching element of the present invention, the material that forms the electrodes that do not supply metal ions to the ion conduction layer (the first electrode and a portion of the second electrode) is not limited to platinum and may be a refractory metal (Ta, Ti, W, Mo) or a silicide (titanium silicide, cobalt silicide, and molybdenum silicide). In addition, the metal that makes up the electrodes that supply metal ions to the ion conduction layer (the third electrode and a portion of the second electrode) is not limited to copper, and may be silver or lead. Still further, the ion conductor that makes up the ion conduction layer is not limited to copper sulfide, and may be a compound of a chalcogen element (O, S, Se, and Te) and a metal, a dielectric that contains silicon (silicon oxide, silicon nitride, silicon oxide-nitride), or a perovskite oxide ($ABO_3$, A:Mg, Ca, Sr, Ba, B:Ti). The diffusion prevention layer may also be any material that suppresses the diffusion of copper ions such as a silicon oxide film or alumina.

The present invention is not limited to the above-described working examples and is open to various modifications within the scope of the invention, these modifications of course being included within the scope of the present invention.

The invention claimed is

1. A switching element comprising:
   an ion conduction layer for conducting metal ions;
   a first electrode and a second electrode provided in contact with said ion conduction layer;
   a third electrode that can supply said metal ions to said ion conduction layer; and
   a diffusion prevention layer provided between said ion conduction layer and said third electrode for preventing diffusion of metal ions from said third electrode to said ion conduction layer.

2. The switching element according to claim 1, wherein a metal precipitate is provided for connecting said first electrode and said second electrode.

3. The switching element according to claim 2, wherein:
said second electrode includes a material that can supply said metal ions to said ion conduction layer; and
said diffusion prevention layer is provided between said second electrode and said ion conduction layer.

4. The switching element according to claim 2, wherein:
said second electrode includes a material that can supply said metal ions to said ion conduction layer; and
said diffusion prevention layer is provided between said second electrode and said ion conduction layer.

5. A reconfigurable logic integrated circuit that employs in a switch the switching element according to claim 1.

6. A switching element comprising:
an ion conduction layer for conducting metal ions;
a first electrode and a second electrode provided in contact with said ion conduction layer and to which a signal voltage is applied as input from the outside;
a third electrode provided in contact with said ion conduction layer and that can supply said metal ions; and
a constant-voltage unit for applying to said third electrode a voltage of one-half the maximum value of said signal voltage.

7. A switching element comprising:
an ion conduction layer for conducting metal ions;
a first electrode and a second electrode provided in contact with said ion conduction layer to which a signal voltage is applied as input from the outside;
a third electrode provided in contact with said ion conduction layer and that can supply said metal ions; and
a switch for cutting off current to said third electrode.

8. A switching element comprising at least an ion conduction layer for conducting metal ions, a first electrode, a second electrode, and a third electrode that can supply said metal ions to said ion conduction layer; wherein:
said first electrode is provided in contact with one surface of said ion conduction layer;
said second electrode and said third electrode are provided on the other surface of said ion conduction layer said second electrode and said third electrode being separated by a predetermined distance parallel to the other of said ion conduction layer;
said second electrode is in contact with said ion conduction layer; and
a diffusion prevention layer is included between said third electrode and said ion conduction layer.

9. A switching element comprising at least an ion conduction layer for conducting metal ions, a first electrode, a second electrode, and a third electrode that can supply said metal ions to said ion conduction layer; wherein:
said second electrode and said third electrode are provided on a substrate, said second electrode and said third electrode being separated by a predetermined distance parallel to a surface of said substrate;
a diffusion prevention layer is included at least on said third electrode; and
said ion conduction layer is provided at least between said second electrode and said third electrode and in contact with said diffusion prevention layer, and said first electrode is provided on said ion conduction layer.

10. A switching element according to claim 9, further comprising a second diffusion prevention layer on said second electrode, wherein said ion conduction layer also extends over said second diffusion prevention layer.

* * * * *